(12) United States Patent
Chang

(10) Patent No.: US 10,658,016 B1
(45) Date of Patent: May 19, 2020

(54) SERIES CONTINUOUS TIME LINEAR EQUALIZERS

(71) Applicant: Integrated Device Technology, Inc., San Jose, CA (US)

(72) Inventor: David Chang, Santa Clara, CA (US)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 16/214,480

(22) Filed: Dec. 10, 2018

(51) Int. Cl.
    *G11C 7/10* (2006.01)

(52) U.S. Cl.
    CPC .......... *G11C 7/1048* (2013.01); *G11C 7/1072* (2013.01)

(58) Field of Classification Search
    None
    See application file for complete search history.

(56) References Cited

U.S. PATENT DOCUMENTS

| | | | | |
|---|---|---|---|---|
| 4,532,542 A | * | 7/1985 | Andrews | H04N 9/78 348/663 |
| 8,058,950 B1 | * | 11/2011 | Senderowicz | H03H 5/02 333/167 |
| 10,014,036 B1 | * | 7/2018 | Zhou | G11C 7/10 |
| 2005/0075126 A1 | * | 4/2005 | Sugiura | G01S 13/84 455/550.1 |
| 2009/0185408 A1 | * | 7/2009 | Takenaka | G06F 13/4077 365/63 |
| 2014/0211534 A1 | * | 7/2014 | Pickett | G11C 13/0002 365/148 |
| 2015/0236647 A1 | * | 8/2015 | Grayzel | H03D 7/04 363/158 |
| 2015/0311932 A1 | * | 10/2015 | Fujii | H04B 3/00 375/233 |

* cited by examiner

*Primary Examiner* — Tan T. Nguyen
(74) *Attorney, Agent, or Firm* — Christopher P. Maiorana, PC

(57) ABSTRACT

An apparatus includes a first continuous time linear equalizer circuit and a second continuous time linear equalizer circuit. The first continuous time linear equalizer circuit may be configured to generate an intermediate signal by filtering an input signal using a first passive bandpass filter having an inductor. The second continuous time linear equalizer circuit may be configured to generate an output signal by filtering the intermediate signal.

20 Claims, 12 Drawing Sheets

SERIES CONTINUOUS TIME LINEAR EQUALIZERS

FIELD OF THE INVENTION

The invention relates to signal filtering generally and, more particularly, to a method and/or apparatus for implementing series continuous time linear equalizers.

BACKGROUND

Power consumption is important in double-data rate data buffer chips and registered clock driver chips. A challenge in the chip designs is to reduce power consumption for continuous time linear equalizers and following circuits that receive signal frequencies of one giga-Hertz and higher. Conventional continuous time linear equalizers designs currently include active designs and passive RC-based designs. Conventional active designs are essentially an amplifier with a source degenerator and a bandpass filter frequency response. However, the conventional active designs burn more power as signal speeds increase. The conventional designs also incur power consumption from summing digital-to-analog circuitry at an output node. Conventional passive designs achieve lower power consumption than the active designs. However, the resistor process variation is about ±20% causing the filter response to drift. The drifts make the circuits hard to calibrate.

It would be desirable to implement series continuous time linear equalizers

SUMMARY

The invention concerns an apparatus including a first continuous time linear equalizer circuit and a second continuous time linear equalizer circuit. The first continuous time linear equalizer circuit may be configured to generate an intermediate signal by filtering an input signal using a first passive bandpass filter having an inductor. The second continuous time linear equalizer circuit may be configured to generate an output signal by filtering the intermediate signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing series continuous time linear equalizers that may (i) achieve a low power performance, (ii) have a low sensitivity to process, temperature and/or voltage, (iii) provide LC tanks in clock paths to reduce clock amplitudes, (iv) provide inductor coupling, (v) provide a lower delay latency, (vi) provide improved timing performance and/or (vii) be implemented as one or more integrated circuits.

Embodiments of the invention generally utilize a sequence of continuous time linear equalizers (CTLE). The sequence may include one or more passive continuous time linear equalizers to achieve a low power performance. An LC-based passive continuous time linear equalizer may be included to achieve both low power and high performance of a frequency response and process control over the process, temperature and voltage. The inductor may have a better process variation when compared with a resistor in common RC designs and a higher quality factor (Q) for a frequency filter response. A size of the inductor size may be reasonable and implementable in (on) an integrated circuit (or chip).

In various embodiments, a common signal receiver may be replaced with an inductor coupling receiver, The inductor coupling receiver may achieve a better performance, a lower power consumption, a lower delay latency, and/or an improved timing performance for the continuous time linear equalizer circuitry and decision feedback equalizer (DFE) circuitry in the receiver compared with common designs.

Furthermore, various embodiments of the invention may include LC tanks in clock paths with a resonant frequency set at an operating frequency of the clocks. The LC tank circuits may recycle the signal energy to further accommodate reduced clock signal amplitudes through the data path and compensation may be provided for losses due to data path resistance. The reduced clock amplitudes may reduce power consumed along the clock paths.

Figure 1:
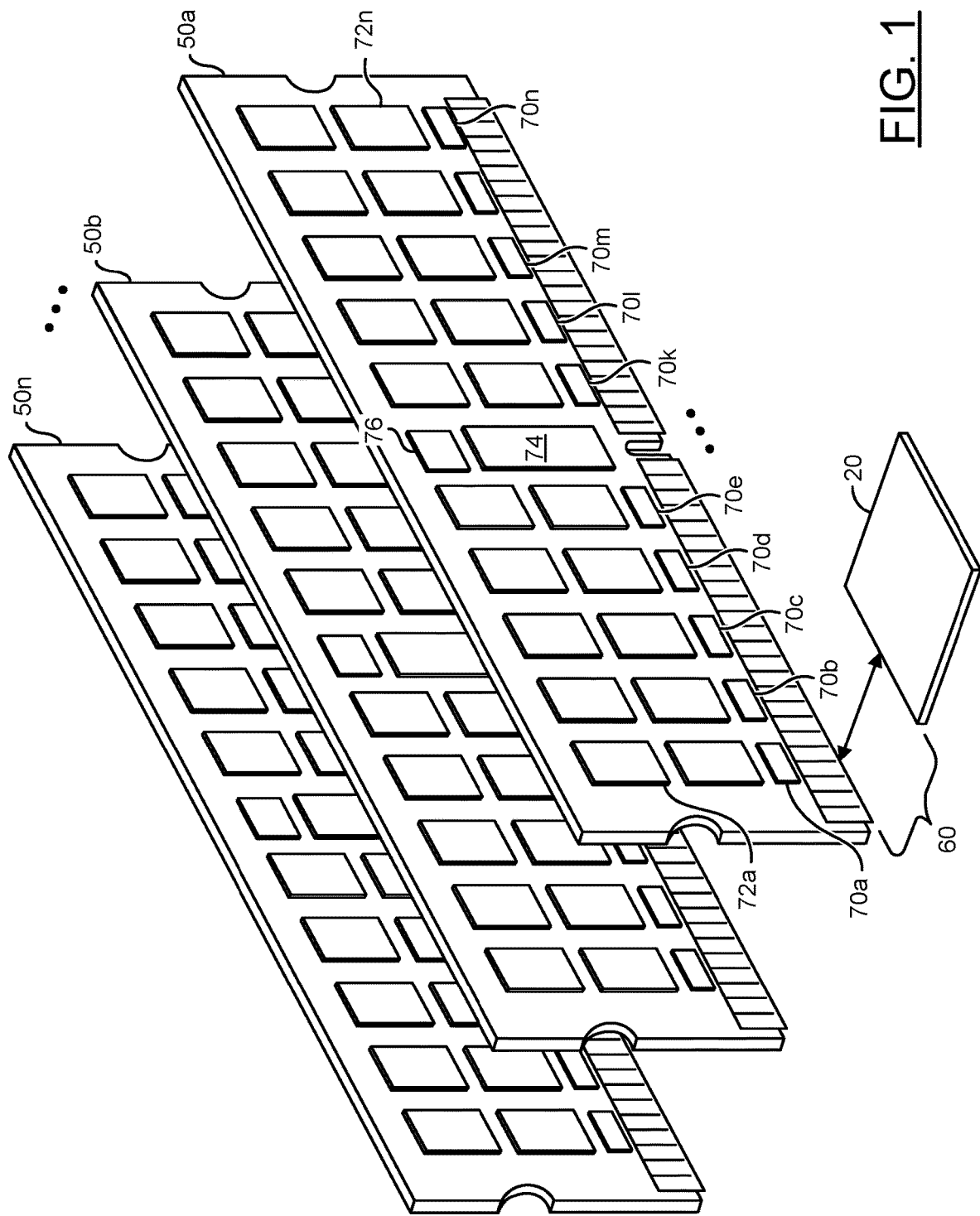
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74, a block (or circuit) 76 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as an RCD circuit compliant with the JEDEC specification (e.g., DDR5 standard). The circuit 76 may be implemented as a power management integrated circuit (PMIC). The type, arrangement and/or number of components of the memory modules 50a-50n may be varied to meet the design criteria of a particular implementation.

The memory modules 50a-50n are shown connected to a block (or circuit) 20. The circuit 20 may implement a memory controller and/or host controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board or host device). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In some embodiments, the connectors/pins/traces 60 may implement an 80-bit bus. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example, the circuits 50a-50n may have a memory module density of 128 gigabyte (GB), one terabyte (TB), or higher per module (e.g., compared to 16 GB per dual in-line memory module (DIMM) in DDR3). In embodiments implementing DDR4 compliant SDRAM memory modules, the circuits 50a-50n may operate at voltages of 1.2-1.4 volts (V) with a frequency between 800-4266 megahertz (MHZ) (e.g., compared to 1.5-1.65V at frequencies between 400-1067 MHZ in DDR3). In embodiments implementing DDR5 compliant SDRAM memory modules, the circuits 50a-50n may operate with a frequency of 1.2-3.2 giga-Hertz (GHz) and/or higher frequencies. In embodiments implementing DDR5 standard SDRAM memory modules, there may be 5 memory modules on each side of the RCD 74.

In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of about 1.6 to 3.6 giga-transfers per second (GT/s) and higher (e.g., compared to 0.8-2.13 GT/s in DDR3). In embodiments implementing DDR5 standard SDRAM memory modules, the circuits 50a-50n may have a data rate range from 3.2 GT/s to 4.6 GT/s. The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4B, June 2017, published by the Joint Electron Device Engineering Council (JEDEC) Solid State Technology Association, Arlington, Va. Appropriate sections of the DDR4 specification (e.g., the DDR4 JEDEC specification) are hereby incorporated by reference in their entirety. In another example, the memory modules 50a-50n may be implemented according to a fifth generation (DDR5) standard (e.g., for which a standard is currently under development by JEDEC). References to the DDR5 standard may refer to a latest working and/or draft version of the DDR5 specification published and/or distributed to committee members by JEDEC as of May 2018. Appropriate sections of the DDR5 standard are hereby incorporated by reference in their entirety. The JEDEC specification may refer to the DDR4 SDRAM specification, a DDR5 SDRAM specification and/or specifications for future generations of DDR SDRAM.

In some embodiments, the memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
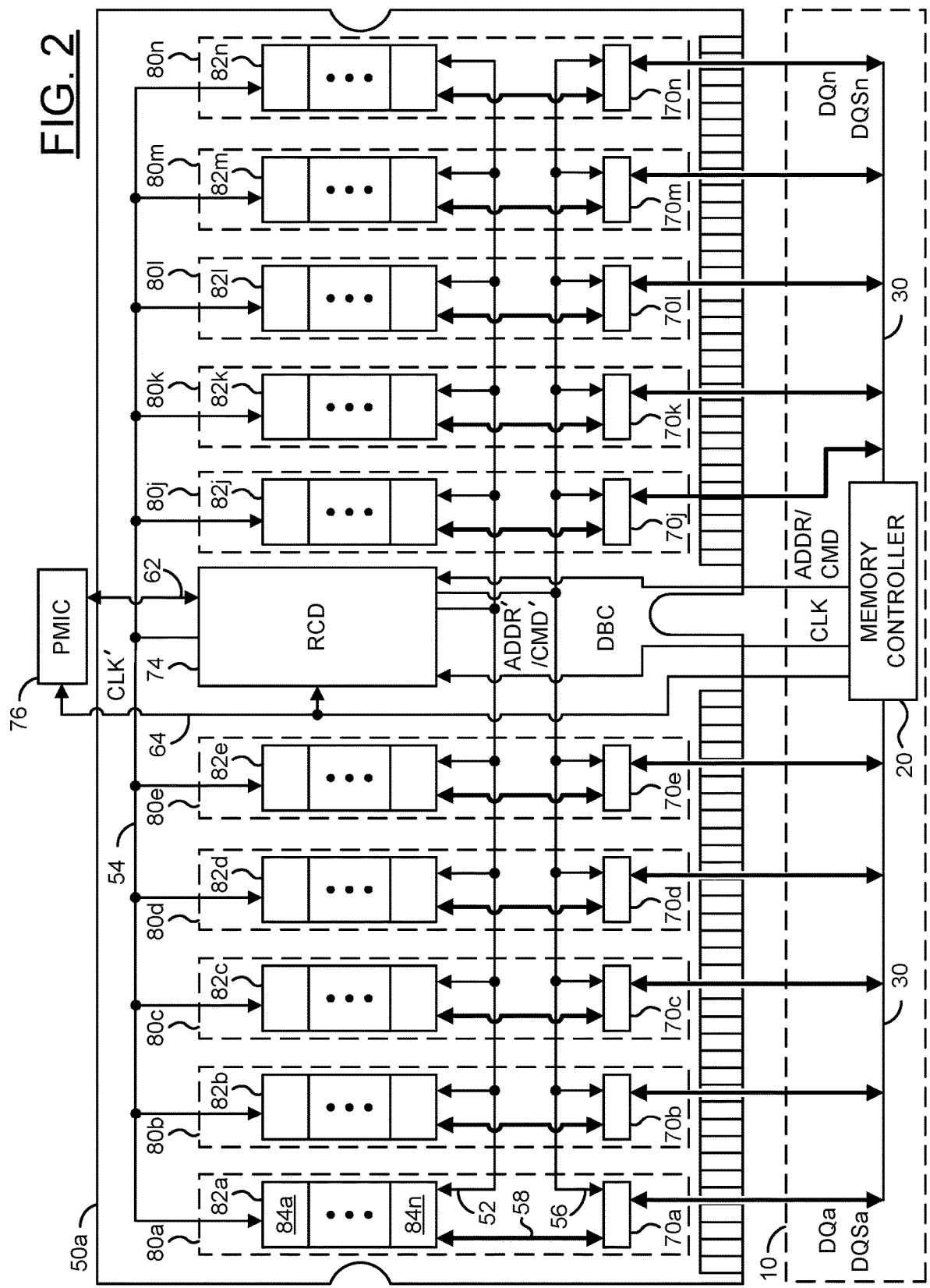
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine or host device that communicates with the memory module 50a.

The memory module 50a may comprise one or more blocks (or circuits) 80a-80n, the RCD circuit 74 and/or the PMIC 76. The circuits 80a-80n may implement data paths of the memory module 50a. For example, the data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a clock signal (e.g., CLK), a number of control signals (e.g., ADDR/CMD) and/or a number of commands. The signal CLK and/or the signals ADDR/CMD may be presented to the RCD circuit 74. The commands may be presented to the PMIC 76 via a bus 64. A data bus 30 may be connected between the memory controller 20 and the data paths 80a-80n. The memory controller 20 may generate and/or receive data signals (e.g., DQa-DQn) and data strobe signals (e.g., DQSa-DQSn) that may be presented/received from the data bus 30. Portions of the signals DQa-DQn and DQSa-DQSn may be presented to respective data paths 80a-80n. For example, the signals DQa-DQn may be the DQ signals defined in the JEDEC specification and the signals DQSa-DQSn may be the DQS signals defined in the JEDEC specification. In the example shown, each of the signals DQa-DQn may have a corresponding signal DQSa-DQSn, however in some embodiments, one DQS signal may strobe multiple (e.g., four) DQ signals.

The RCD circuit 74 may be configured to communicate with the memory controller 20, the data buffers 70a-70n, the memory channels 82a-82n and/or the PMIC 76. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In an example, the RCD circuit 74 may implement a serial communication bus (e.g., a 1 MHz inter-integrated circuit ($I^2C$) bus, etc.). However, other types of management bus protocols (e.g., sideband interface, etc.) may be implemented to meet design criteria of particular implementations. In some embodiments, the RCD circuit 74 may implement a 12.5 MHz inter-integrated circuit ($I^3C$) bus. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may correspond with a signal Y_CLK in the DDR4 specification. The signal CLK' and/or the signals ADDR'/CMD' may be presented to each of the memory channels 82a-82n. In one example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for x4 DRAMS or 8-bit bytes for x8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

An interface 62 is shown. The interface 62 may be configured to enable communication between the RCD circuit 74 and the PMIC 76. For example, the interface 62 may implement a register clock driver/power management integrated circuit interface (e.g., an RCD-PMIC interface). The interface 62 may comprise one or more signals and/or connections. Some of the signals and/or connections implemented by the interface 62 may be unidirectional. Some of the signals and/or connections implemented by the interface 62 may be bidirectional. The interface 62 may be enabled by the host memory controller 20. In one example, the memory controller may enable the interface 62 for the RCD using the signal ADDR/CMD. In another example, the memory controller 20 may enable the interface 62 for the PMIC 76 by presenting an enable command.

The bus 64 may be implemented as a host interface bus. The host interface bus 64 may be bi-directional. The host interface bus 64 may be configured to communicate commands and/or other data to the PMIC 76 and/or other components of the memory module 50a. In some embodiments, the bus 64 may communicate with the RCD 74. In some embodiments, the host interface bus 64 may implement an I²C protocol. In some embodiments, the host interface bus 64 may implement an I³C protocol. The protocol implemented by the host interface 64 may be varied according to the design criteria of a particular implementation.

Figure 3:
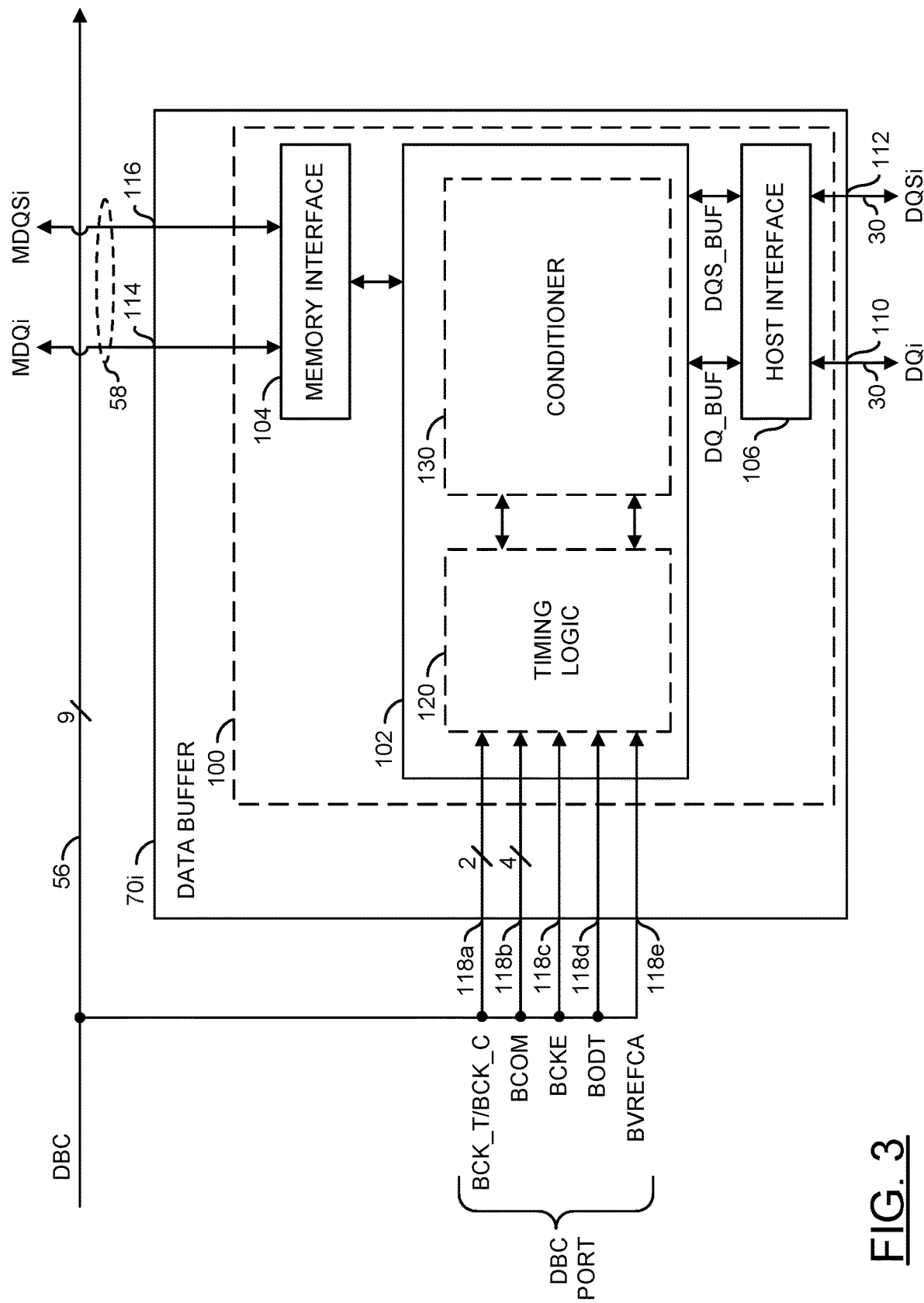
FIG. 3 is a block diagram illustrating an example data buffer of FIG. 1.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 110, a second input/output 112, a third input/output 114 and a fourth input/output 116.

The first input/output 110 is configured for presenting/receiving the signals DQi (e.g., the data signals DQ corresponding to a memory channel) between the data buffer 70i and the controller 20. The second input/output 112 is configured for presenting/receiving the signals DQSi (e.g., the data strobe signals DQS corresponding to the memory channel) between the data buffer 70i and the controller 20. The third input/output 114 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 116 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffer 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 118a receiving the signals BCK_T/BCK_C, an input 118b receiving the signal BCOM, an input 118c receiving the signal BCKE, an input 118d receiving the signal BODT, and an input 118e receiving the signal BVREFCA.

In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the duplex data buffers 70a-70n. In an example, the signal BCOM may be implemented at a single data rate (e.g., 1 bit per signal per clock cycle). However, a particular command may take a different number of clock cycles to transfer information. The signal BCKE may implement a buffered clock enable signal. In an example, the signal BCKE may be a function registered dedicated non-encoded signal (e.g., DCKE). The signal BODT may implement a buffered on-die termination signal. In an example, the signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the respective channel of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the duplex data buffer, and complete the buffer command in the buffer control word.

A function of the signal BCOM may be to transmit the buffer control words. However, compliant with the JEDEC specification for DDR4 SDRAM, the duplex RCD circuit 74 may send all read/write commands and some MRS information over the bus 56 (e.g., to allow the data buffers 70a-70n to keep track of what the memory devices 72 are doing). In some embodiments, different buffer commands may take a different number of cycles to transfer the information.

In embodiments, implementing DDR4 SDRAM, the RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

In implementations compliant with DDR5, the RCD circuit 74 may receive a mode register write (MRW) command from the memory controller 20. The RCD circuit 74 forwards MRW commands to the memory devices 72a-72n and to the data buffers 70a-70n as long as the respective output interfaces are enabled to forward commands. The MRW commands generally contain a control word (CW) bit. The CW bit generally indicates if the command is intended for the memory devices 72a-72n or for the logic devices (e.g., the RCD circuit 74 or the data buffers 70a-70n). In MRW commands targeting the logic devices, the most significant bit of an 8-bit control word address may be used, for example, to identify if the target device is the RCD circuit 74 or the data buffers 70a-70n. In general, all devices in the memory modules 50a-50n have an opportunity to snoop configuration information intended for the other devices in the same module.

The data buffers 70a-70n may be configurable. The buffer commands may allow the memory controller 20 to customize aspects of termination (e.g., ODT) and, signal strength (e.g., DRV) on the DQ and DQS lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also be utilized to send commands (e.g., data reads and/or data writes) that control data traffic through the data buffers 70a-70n. For example, some commands may optimize power consumption and noise filtering (e.g., equalization) of the data buffers 70a-70n. In another example, read/write delays may be added per data line.

The data buffers 70a-70n may implement dual multi-bit (e.g., 4-bit) bi-directional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may comprise a block (or circuit or module or apparatus) 100. The circuit 100, implemented in one or more of the data buffers 70a-70n, may be configured to enable a decision feedback equalizer (DFE) open loop training architecture for a data buffer in a double data rate (DDR) memory system. The circuit 100 may be configured to obtain DFE coefficients by training each specific channel and system setting. For example, the circuit 100 may implement an open loop training approach. In some embodiments, the circuit 100 may be configured to mitigate intersymbol interference. For example, the intersymbol interference may be caused by bandwidth limitations and/or reflections. The circuit 100 may be configured to implement a training method to obtain DFE tap coefficients.

The circuit 100 may comprise a receiver data path for the data buffers 70a-70n. In the example shown, the circuit 100 may comprise a block (or circuit) 102, a block (or circuit) 104 and/or a block (or circuit) 106. The circuit 102 may implement one or more circuits and/or modules. In some embodiments, the circuit 102 may implement variable delay circuits, phase blender circuits and/or phase interpolator circuits. The circuit 104 may implement a memory interface. The circuit 106 may implement a host interface. The circuit 102 may generate/receive a signal (e.g., DQ_BUF) and/or a signal (e.g., DQS_BUF). In the example shown, the signal DQ_BUF may be a buffered version of the data signal DQi and the signal DQS_BUF may be a buffered version of the data strobe signal DQSi.

The circuit 102 may comprise a block (or circuit) 120 and/or a block (or circuit) 130. Details of the circuits 100-104, 120 and/or 130 may be described in association with FIGS. 5-12. The circuit 100 may comprise other components and/or circuits (not shown). The number and/or type of components and/or the signals transmitted between the circuits of the apparatus 100 may be varied according to the design criteria of a particular implementation.

The circuit 120 may implement a timing logic circuit. In one example, the circuit 120 may be configured to solve complications and/or bandwidth limits caused by using a DLL and/or PLL in DDR5 when fixing a constant tPDM. In another example, the circuit 120 may be implemented as a fast loop compared to a DLL and/or PLL solution. In yet another example, the open loop architecture of the circuit 120 may reduce an accumulation of jitter in the source synchronization system enabling the data signals (e.g., DQi and/or MDQi) and the clock signals (e.g., DQSi and/or MDQSi) to track each other. The circuit 120 may be configured to align a strobe (e.g., clock) signal with a data signal to be parallel through a memory data path using a constant delay.

The circuit 130 may implement a conditioner circuit. The conditioner 130 is generally operational to improve a data eye height and improve width shmoo results by filtering the information in the input signals DQ_BUF and DSQ_BUF. The conditioner 130 generally achieves a high frequency boosting relative to a low frequency gain. The boosting may compensate to some extent for channel loss and reflections at a frequency of interest. The compensation generally reduces signal distortion due to an insertion loss and a return loss of the channels in the data bus 30.

Figure 4:
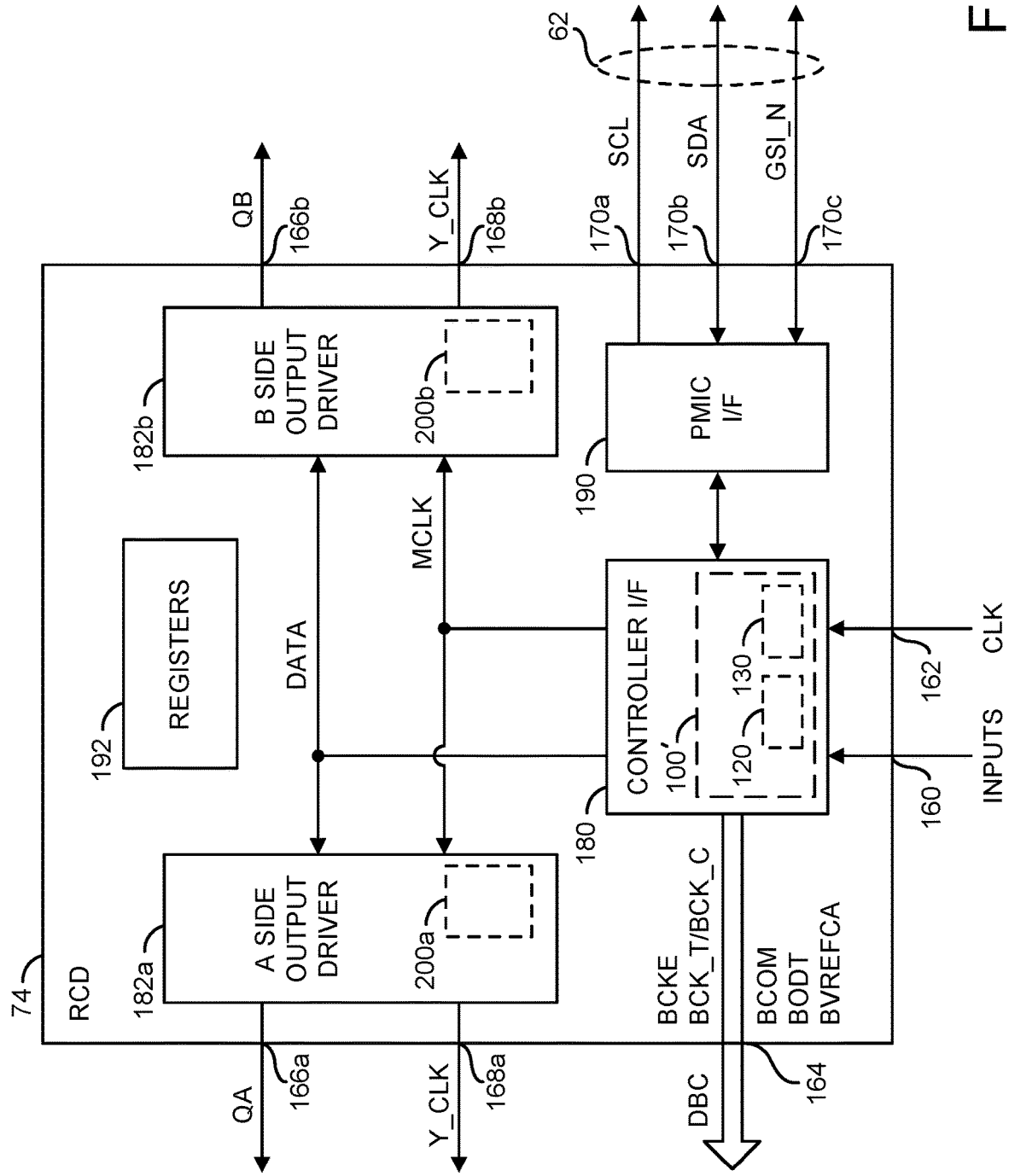
FIG. 4 is a diagram illustrating a registered clock driver (RCD) in accordance with an embodiment of the invention.

Referring to FIG. 4, a diagram is shown illustrating the registered clock driver 74 in accordance with an embodiment of the invention. In various embodiments, the circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va. and/or compliant with the DDR5 standard).

The circuit 74 may have an input 160 that receives input data (e.g., INPUTS), an input 162 that receives the clock signal CLK, an input/output 164 that may receive/transmit control information (e.g., DBC), outputs 166a and 166b that may provide data outputs (e.g., the Q outputs QA and QB, respectively), outputs 168a and 168b that may provide output clock signals (e.g., Y_CLK) and/or inputs/outputs 170a-170c that may send/receive data via the interface 62. The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

The output 170a may present a signal (e.g., SCL). The input/output 170b may communicate a signal (e.g., SDA). The input/output 170c may communicate a signal (e.g., GSI_N). The signal SCL may be a clock signal. The signal SDA may be a data signal. For example, the signal SDA may communicate power data. The signal GSI_N may be an interrupt signal. The signal SDA and/or the signal GSI_N may be a bi-directional signal. The signal SCL, the signal SDA and/or the signal GSI_N may each be a portion of the information communicated using the RCD-PMIC interface 62. The number of signals, the number of connections and/or the type of data communicated using the RCD-PMIC interface 62 may be varied according to the design criteria of a particular implementation.

In various embodiments the circuit 74 may comprise a block 180, blocks (or circuits) 182a-182b, a block (or circuit) 190 and/or a block (or circuit) 192. The block 180 may implement a controller interface. The blocks 182a and 182b may implement output driver circuits. In some embodiments, the blocks 182a and 182b may be combined as a single output driver circuit 182. The block 190 may implement a PMIC interface (or port) 190. The block 192 may implement register space. The RCD circuit 74 may comprise other components (not shown). The number, type and/or arrangement of the components implemented by the RCD 74 may be varied according to the design criteria of a particular implementation.

The block 180 may be configured to generate a data signal (e.g., DATA) and a clock signal (e.g., MCLK). The block 180 may be configured to generate the pair of signals (e.g., BCK_T/BCK_C), a signal (e.g., BCOM), a signal (e.g., BCKE), a signal (e.g., BODT) and/or a signal (e.g., BVREFCA). The signals DATA and MCLK may be presented to the blocks 182a and 182b. In various embodiments, the signal DATA may be coupled to the blocks 182a and 182b by combinatorial logic (not shown). The blocks 182a and 182b may be configured to generate the signals QA, QB and Y_CLK.

The block 190 may be configured to generate the signal SCL. The block 190 may be configured to generate and/or receive the signal SDA and/or the signal GSI_N. The block 190 may be coupled with the controller interface 180. For example, the PMIC interface 190 and/or the controller interface 180 may be configured to facilitate communication between the PMIC 76 and the memory controller 20. The PMIC interface 190 may be enabled in response to the enable command received from the host memory controller 20. In an example, the enable command may be a VR Enable command generated by the host memory controller 20.

The block 192 may be configured to store data. For example the block 192 may comprise a number of registers used for reading from and/or writing to the RCD circuit 74. Generally, the register space 192 is coupled to the various components of the RCD using combinational logic (not shown). The block 192 may comprise a pre-defined register space to store and/or communicate power data received from and/or to be written to the PMIC 76. The pre-defined registers may store configuration data used to adjust an operating state and/or a status of the RCD 74, the interface 62 and/or the PMIC 76. In some embodiments, one or more counters may be implemented to track control words received from the host memory controller 20.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. In another example, a DDR5 standard registered clock driver (RCD) may have a number of pins defined by the DDR5 standard. However, other numbers of output pins may be implemented to meet the design criteria of a particular implementation.

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

The signal SCL may be a clock signal generated by the RCD 74. The signal SCL may be a clock signal that operates independently from the system clock signal (e.g., the signals BCK_T/BCK_C, the signal CLK and/or the signal MCLK)). In an example, the clock signal SCL may be an I²C clock output from the RCD 74 to the PMIC 76 communicated over the point-to-point interface 62. The signal SDA may be a data signal generated by the RCD 74 and/or received by the RCD 74. For example, the signal SDA may enable the host memory controller 20 to write to the PMIC 76 through the RCD 74 and/or read from the PMIC 76 through the RCD 74. In an example, the power data signal SDA may be an I²C data input/output between the RCD 74 and the PMIC 76 communicated over the point-to-point interface 62. The RCD 74 may use the interface 62 to send/receive the power data to/from the PMIC 76. The host memory controller 20 may perform a read operation and/or a write operation to the RCD 74 as defined by the DDR5 standard. For example, the host memory controller 20 may read the power data stored in the pre-defined registers. In another example, the host memory controller 20 may write instructions for the PMIC 76 into the pre-defined registers.

The RCD 74 may use the interface 62 to perform periodic polling and/or interrupt handling. The RCD 74 may use the interface 62 to communicate to the PMIC 76 that the memory module(s) 50a-50n are in a low powered state. The PMIC 76 may detect the notification from the interrupt signal GSI_N and respond accordingly.

In some embodiments, the RCD circuit 74 may comprise the circuit 100'. In some embodiments, the circuit 100' may be implemented wholly or partially within the circuit 180. In some embodiments, the RCD circuit 74 may implement multiple instances of the circuit 100'. The circuit 100' implemented within the RCD circuit 74 may be configured to implement an architecture for obtaining DFE tap coefficients through an open loop training approach in a double data rate (DDR) memory system. The circuit 100' may have a similar implementation and/or functionality in the RCD 74 as the circuit 100 in the data buffers 70a-70n (e.g., as shown in association with FIG. 3). Details of the circuit 100' may be described in association with FIGS. 5-12.

Figure 5:
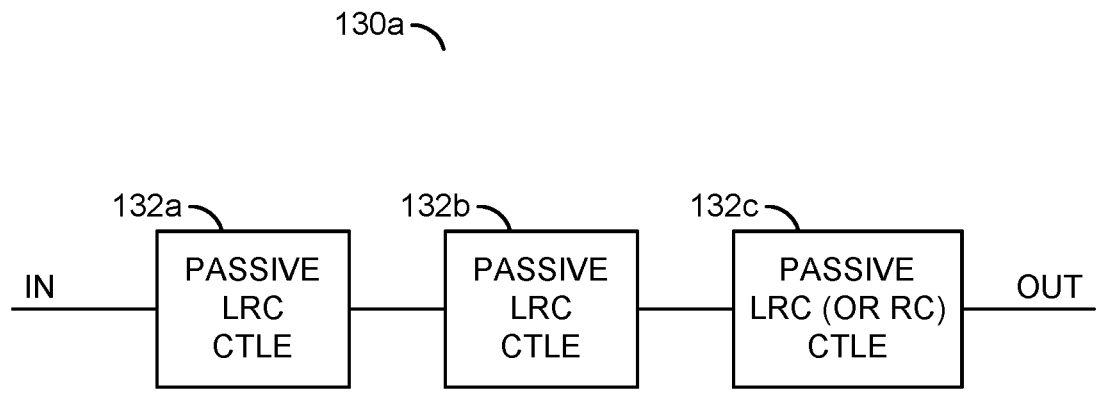
FIG. 5 is a diagram illustrating a conditioner circuit accordance with an example embodiment of the invention.

Referring to FIG. 5, a diagram illustrating an example implementation of a conditioner 130a is shown in accordance with an example embodiment of the invention. The conditioner 130a may be representative of the conditioner 130 shown in FIGS. 3 and 4. The conditioner 130a generally comprises a block (or circuit) 132a, a block (or circuit) 132b and a block (or circuit) 132c. The circuits 132a-132c may be implemented with hardware and/or simulated with software.

An input signal (e.g., IN) may be received by the circuit 132a. The input signal IN may be representative of any of the signals DQ_BUF, DQS_BUF, ADDR/CMD and/or CLK. An output signal (e.g., OUT) may be generated by the circuit 132c. The signal OUT may carry a conditioned version of the signal IN.

Each circuit 132a-132c may implement a passive continuous time linear equalizer circuit. In various embodiments, each circuit 132a-132c may implement a passive LRC-type continuous time linear equalizer circuit. In some embodiments, at least one of the circuits 132a-132c (e.g., 132c) may implement a passive RC-type continuous time linear equalizer circuit. Each circuit 132a-132c may be operational to perform a bandpass filter (or transfer) function to compensate for channel loss.

Figure 6:
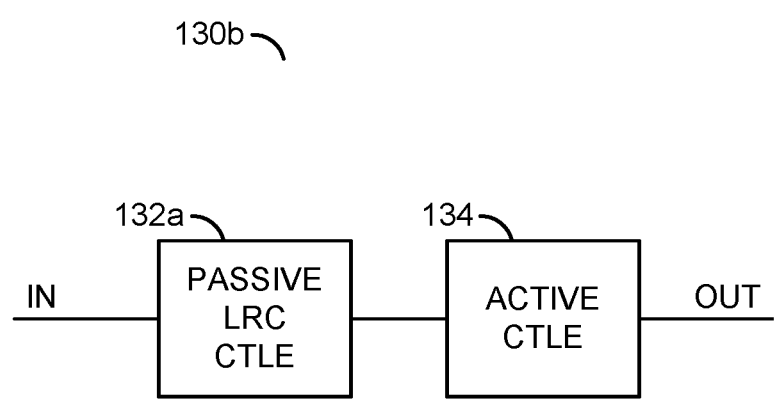
FIG. 6 is a diagram illustrating another conditioner circuit in accordance with an example embodiment of the invention.

Referring to FIG. 6, a diagram illustrating an example implementation of a conditioner 130b is shown in accordance with an example embodiment of the invention. The conditioner 130b may be representative of the conditioner 130 shown in FIGS. 3 and 4. The conditioner 130b generally comprises the circuit 132a and a block (or circuit) 134. The circuits 132a-134 may be implemented with hardware and/or or simulated with software. The input signal IN may be received by the circuit 132a. The output signal OUT may be generated by the circuit 134. The signal OUT may carry a conditioned version of the signal IN.

The circuit 134 may implement an active continuous time linear equalizer circuit. The circuit 134 is generally operational to perform a bandpass transfer function to compensate for channel loss. The transfer function may cancel both precursor and long-tail inter-symbol interference in the signal IN. The circuit 134 may also be operational to increase an overall gain of the circuit 130b by amplification of an intermediate signal received from the circuit 132a.

Figure 7:
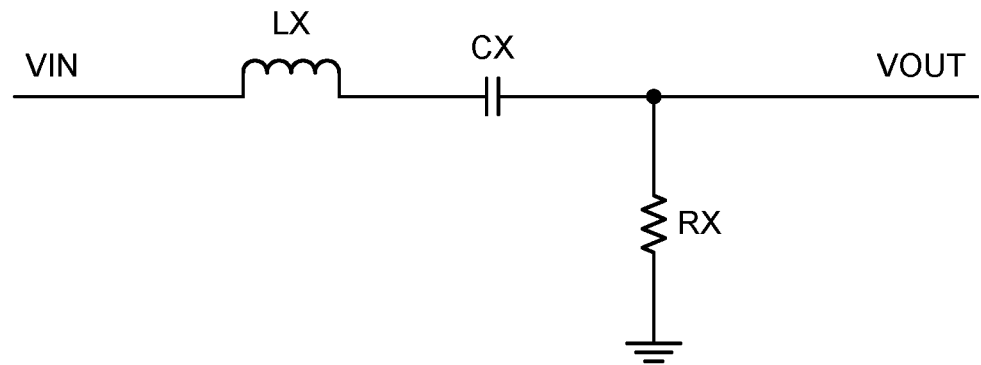
FIG. 7 is a diagram illustrating a passive LRC continuous time linear equalizer in accordance with an example embodiment of the invention.

Referring to FIG. 7, a diagram illustrating an example implementation of a passive LRC continuous time linear equalizer 132x is shown in accordance with an example embodiment of the invention. The circuit 132x may be representative of any of the circuits 132a-132c. The circuit 132x generally comprises an inductor LX, a capacitor CX and a resistor RX. A signal (e.g., VIN) may be received by the inductor LX. A signal (e.g., VOUT) may be presented by a junction between the capacitor CX and the resistor RX.

The inductor LX and the capacitor CX may be connected as a series tank circuit between an input node and an output node of the circuit 132x. The inductor LX and the capacitor CX may have a bandpass response determined by the inductance and the capacitance. The resistor RX may be connected between the output node and signal ground. In an example embodiment, the inductor LX may have an inductance of 2.5 nanohenry (nH), the capacitor CX may have a capacitance of 1.3 picofarads (pF) and the resistor RX may have a resistance of 100 ohms. A center frequency of the circuit 132x may be approximately 2.8 GHz. Other values of the inductance, capacitance and/or resistance may be implemented to meet a design criteria of a particular application.

Figure 8:
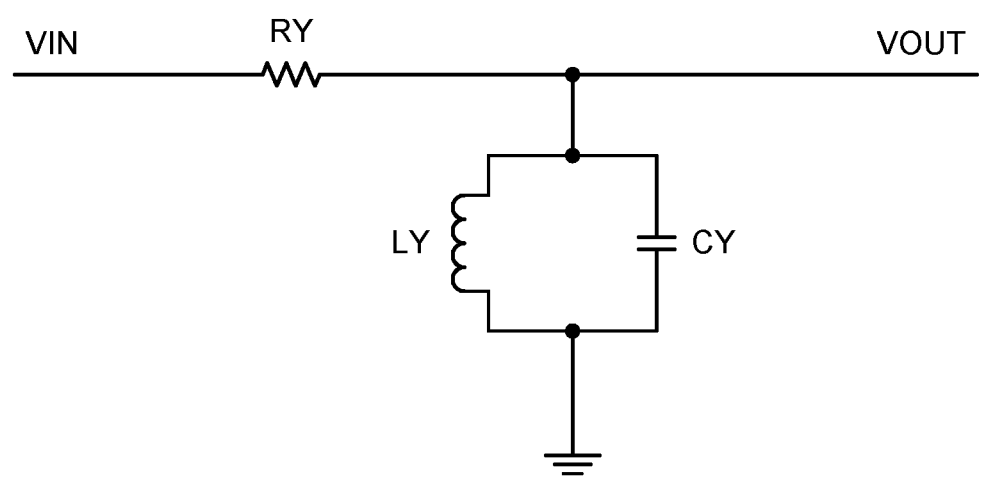
FIG. 8 is a diagram illustrating another passive LRC continuous time linear equalizer in accordance with an example embodiment of the invention.

Referring to FIG. 8, a diagram illustrating another example implementation of another passive LRC continuous time linear equalizer 132y is shown in accordance with an example embodiment of the invention. The circuit 132y may be representative of any of the circuits 132a-132c. The circuit 132y generally comprises an inductor LY, a capacitor CY and a resistor RY. The signal VIN may be received by the resistor RY. The signal VOUT may be presented by a junction between the resistor RY, the inductor LY and the capacitor CY.

The resistor RY may be connected between an input node and an output node of the circuit 132y. The inductor LY and the capacitor CY may be connected as a parallel tank circuit. The inductor LY and the capacitor CY may have a bandpass response determined by the inductance and the capacitance. The parallel tank circuit may be connected to the output node of the circuit 132y. In an example embodiments, the inductor LY may have an inductance of 10 nH, the capacitor CY may have a capacitance of 1.3 pF and the resistor RY may have a resistance of 1 ohm. A center frequency of the circuit 132y may be approximately 3.5 GHz. Other values of the inductance, capacitance and/or resistance may be implemented to meet a design criteria of a particular application.

Figure 9:
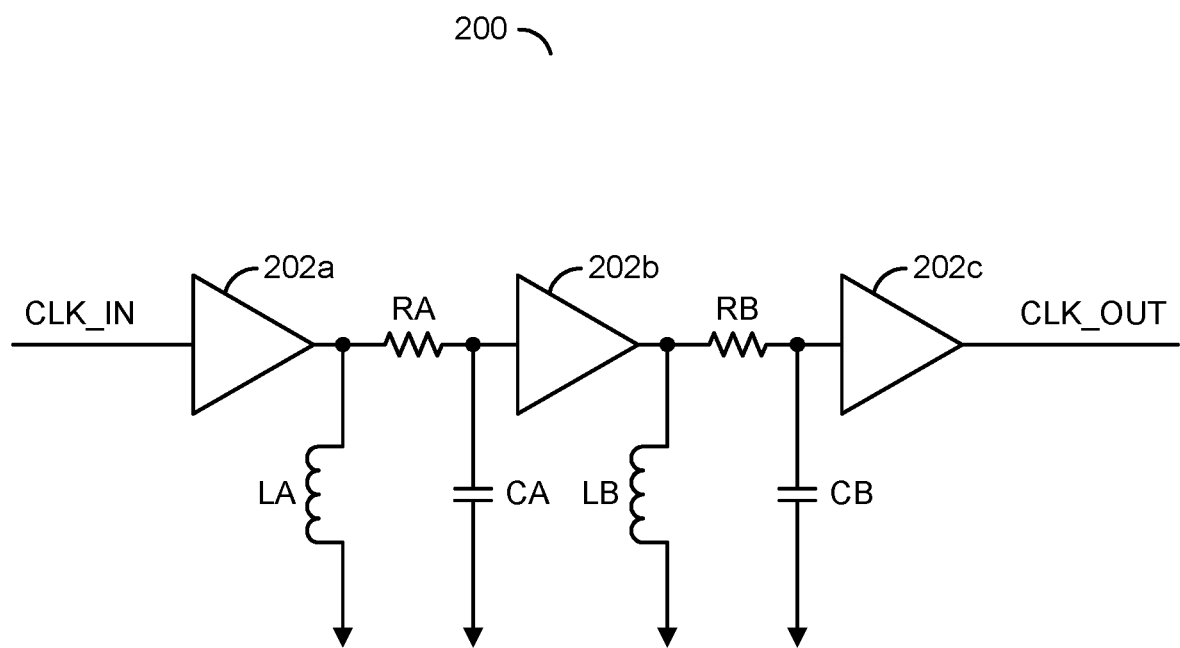
FIG. 9 is a diagram illustrating a resonant clock path circuit in accordance with an example embodiment of the invention.

Referring to FIG. 9, a diagram illustrating an example implementation of a resonant clock path circuit 200 is shown in accordance with an example embodiment of the invention. The resonant clock path circuit 200 generally comprises multiple blocks (or circuits) 202a-202c, multiple resistors RA-RB, multiple inductors LA-LB and multiple capacitors CA-CB. The circuits 202a-202c, the resistors RA-RB, the inductors LA-LB and the capacitors CA-CB may be implemented with hardware and/or simulated with software.

An input clock signal (e.g., CLK_IN) may be received by the circuit 202a. The signal CLK_IN may be representative of any of the clock signals CLK, CLK', BCK_T/BCK_C and/or Y_CLK. An output clock signal (e.g., CLK_OUT) may be generated by the circuit 202c. The signal CLK_OUT may carry a version of the signal CLK_IN. Due to a loss through the resistance of the data bus and a relatively large resistance with a narrow bus in a submicron design process, the circuit bandwidth may be limited and reduced by the resistances (e.g., RC filter response). Therefore, a reduction in a length and a reduction in the resistance of the layout clock bus may be appropriate. An example solution may be to add more amplifiers 202a-202c as repeaters along the clock trace and insert the tank circuits between the repeaters. For longer traces, more repeaters and more tank circuits may be implemented.

For an idea layout of the circuit, very small (e.g., <1 ohm) resistors may be ignored, and the signal energy is generally recycled between the inductors and the capacitors. Therefore, no appreciable energy loss is experienced. However, in a real layout, the resistors of the clocking bus may cause an energy loss and reduce the signal amplitude. In various implementations, the reduced signal amplitude may be acceptable as long as the signal may drive the buffers. In other embodiments, the input signal amplitude may be increased to compensate for the loss, or at least bring up the signal level to an acceptable level that may switch the buffers.

Each circuit 202a-202c may implement an amplifier (or buffer) circuit. Each circuit 202a-202c is generally operational to amplify the received clock signal (e.g., CLK_IN) to generate an amplified clock signal (e.g., CLK_OUT). The amplifiers 202a-202c may be connected in series to distribute the clock signal. A parasitic line resistance (e.g., represented by resistors RA-RB) may be connected in series between each neighboring pair of amplifiers 202a-202c. An output node of each amplifier 202a-202b may be connected to the signal ground through a corresponding inductor LA-LB. An input node of each amplifier 202b-202c may be connected to the signal ground through a corresponding capacitor CA-CB.

The clock path circuit 200 may include multiple LC resonant circuits (e.g., LA+CA, LB+CB, etc.) between neighboring pairs of the amplifiers 202a-202c to save the power. An amplitude of the signal CLK_IN may be reduced due to losses caused by the parasitic resistors RA-RB. The LC resonant circuits and the amplifiers 202a-202c may compensate the loss due to the resistors and restore the clock signal to a full swing (e.g., 0 to VDD). The resonant frequency may be wide, not too sharp or Hi-Q circuit so the path 200 may not be too sensitive to the resonant frequency of the signal CLK_IN. For example, around a center frequency of 2.2 GHz, the peak gain may be set in a range of 3 dB to 10 dB, and a DC gain may be 0 dB with a bandwidth of +500 MHz or even higher.

Figure 10:
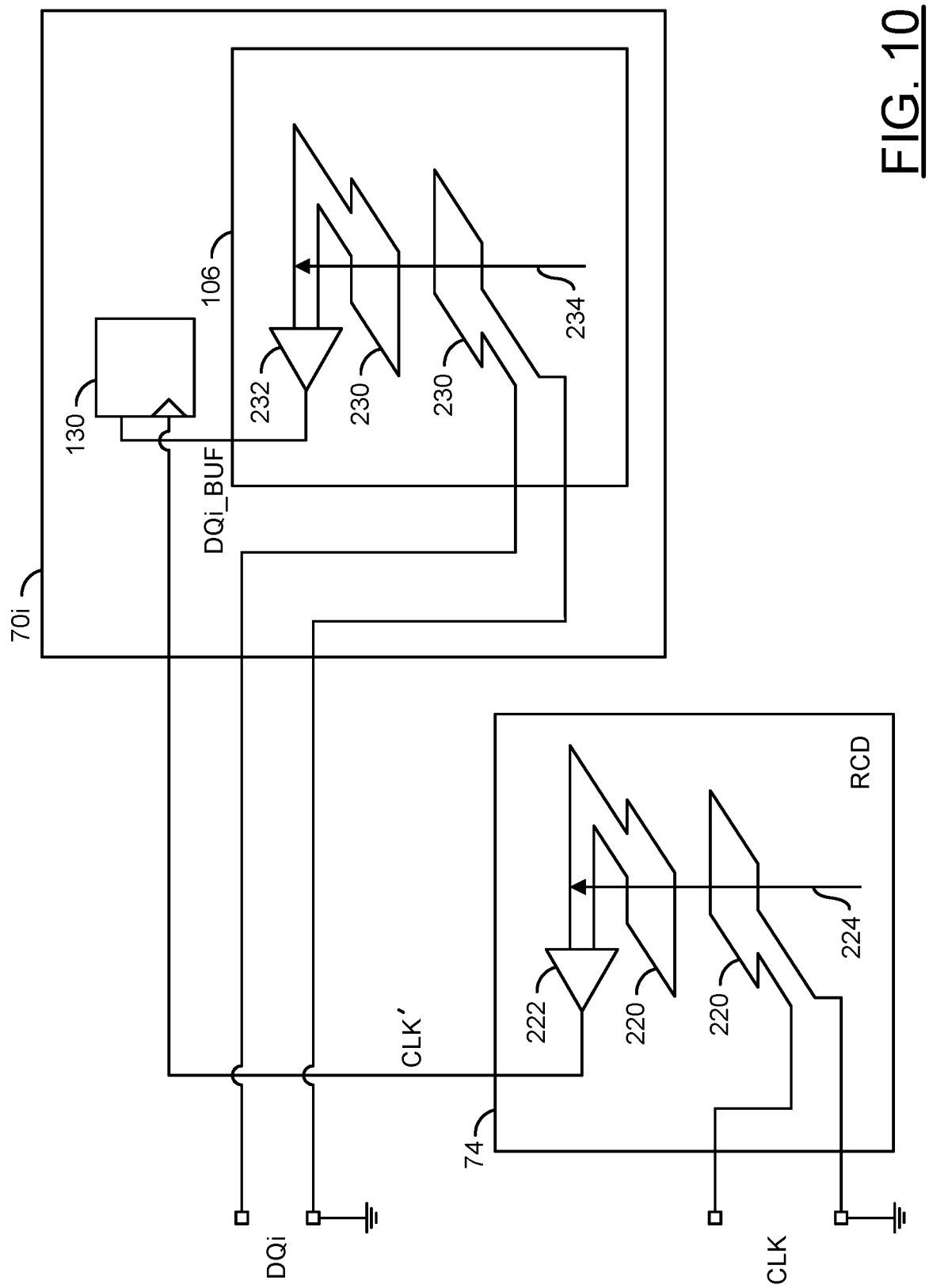
FIG. 10 is a diagram illustrating inductive coupling in accordance with an example embodiment of the invention.

Referring to FIG. 10, a diagram illustrating an example implementation of inductor-to-inductor coupling is shown in accordance with an example embodiment of the invention. The inductor-to-inductor coupling may be implemented in the data buffer circuits 70a-70n (e.g., represented by a circuit 70i) and/or in the RCD circuit 74. The signals DQa-DQn (e.g., represented by a signal DQi) may be inductively coupled to the circuit 70i. The signal CLK may be inductively coupled into the RCD circuit 74.

The RCD circuit 74 may further comprise a block (or circuit) 220 and a block (or circuit) 222. The DB circuit 70i generally comprises the conditioner circuit 130 and the host interface 106. The host interface 106 may comprises a block (or circuit) 230 and a block (or circuit) 232. The circuits 220-222 and 230-232 may be implemented with hardware and/or simulated with software.

The signal CLK may be received by the circuit 220. The circuit 222 may generate the signal CLK' that is transferred to the circuit 130. The circuit 230 may receive the signal DQi. The circuit 232 may present the signal DQi_BUF to the circuit 130.

The circuits 220 and 230 may each implement a transformer circuit. Each transformer 220 and 230 may include a primary winding and a secondary winding. The transformer 220 may generate a magnetic field 224 that couples the signal CLK from the primary winding to the secondary winding. The secondary winding may be directly connected to the input nodes of the circuit 222. The transformer 230 may generate a magnetic field 234 that couples the signal DQi from the primary winding to the secondary winding. The secondary winding may be directly connected to the input nodes of the circuit 232.

Each circuit 222 and 232 may implement a buffer circuit. The buffer 222 is generally operational to amplify the signal CLK received from the secondary winding of the transformer 220 to generate the signal CLK'. The buffer 232 is generally operational to amplify the signal DQi received from the secondary winding of the transformer 230 to generate the signal DQi_BUF.

The transformer 220 and the buffer 222 may be configured to replace a clock tree used to manage timings for transmitting the data signals. Generally, a clock tree may cause a mismatch between the timings of the clocks and the data bits. For example, in a traditional data path, the conditioner 130 may not transmit the signal DQi until the signal CLK' is received from the clock tree. However, the complexity of the clock tree may introduce a delay.

The transformers 220 and 230 and the buffers 222 and 232 may be configured to prevent a mismatch between the transmission of the data bits. For example, the transformers 220 and 230 and the buffers 222 and 232 may be located physically near the connectors/pins 60. Therefore, a minimal opportunity exists for a skew to be created by a traditional clock tree between the signal CLK and all of the signals DQa-DQn.

Figure 11:
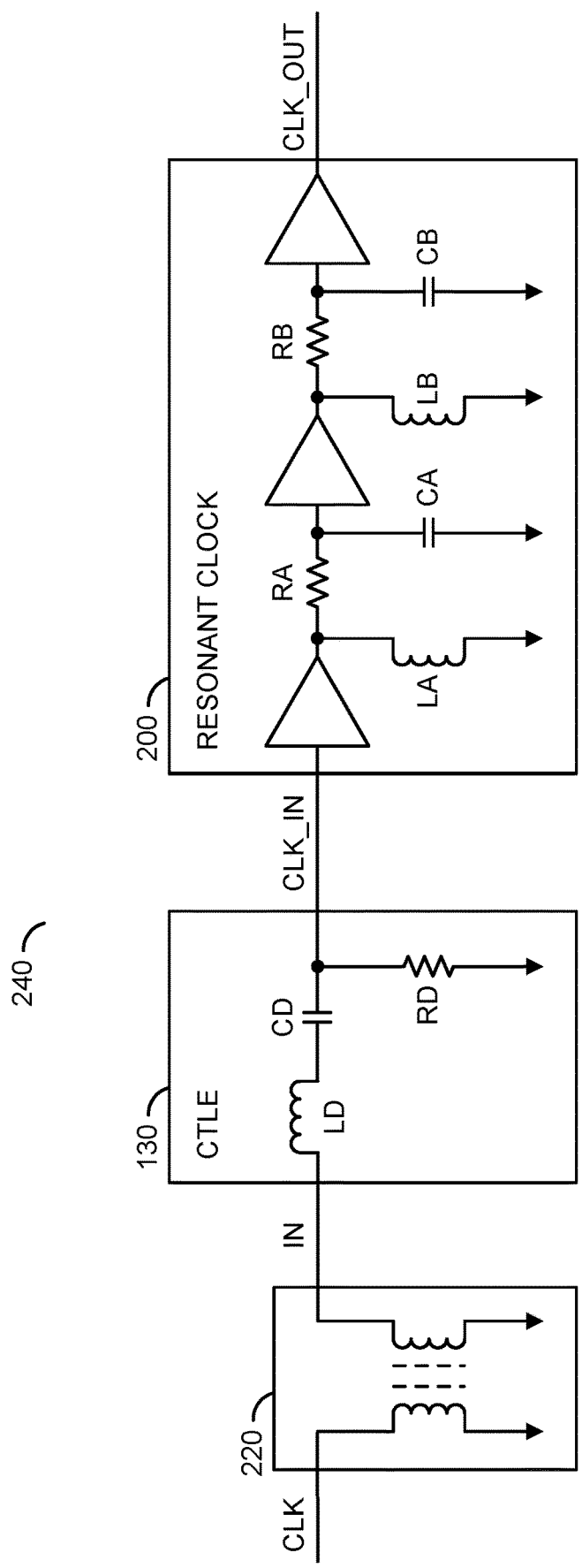
FIG. 11 is a diagram illustrating a receive path in accordance with an example embodiment of the invention.

Referring to FIG. 11, a diagram illustrating an implementation of a receive path 240 is shown in accordance with an example embodiment of the invention. The path 240 generally comprises the transformer 220, the conditioner 130, and the clock path circuit 200. Other circuits may be included in the path 240 to meet the design criteria of a particular application.

The signal CLK may be received by the transformer 220. The transformer 220 may couple the signal CLK to the conditioner 130 as the signal IN. The conditioner 130 may filter the input signal IN and generate the clock signal CLK_IN. The signal CLK_IN may be received at one end of the path circuit 200. The path circuit 200 may distribute the clock signal to other parts of the module 50 where the clock signal CLK_OUT (e.g., CLK') is utilized.

Figure 12:
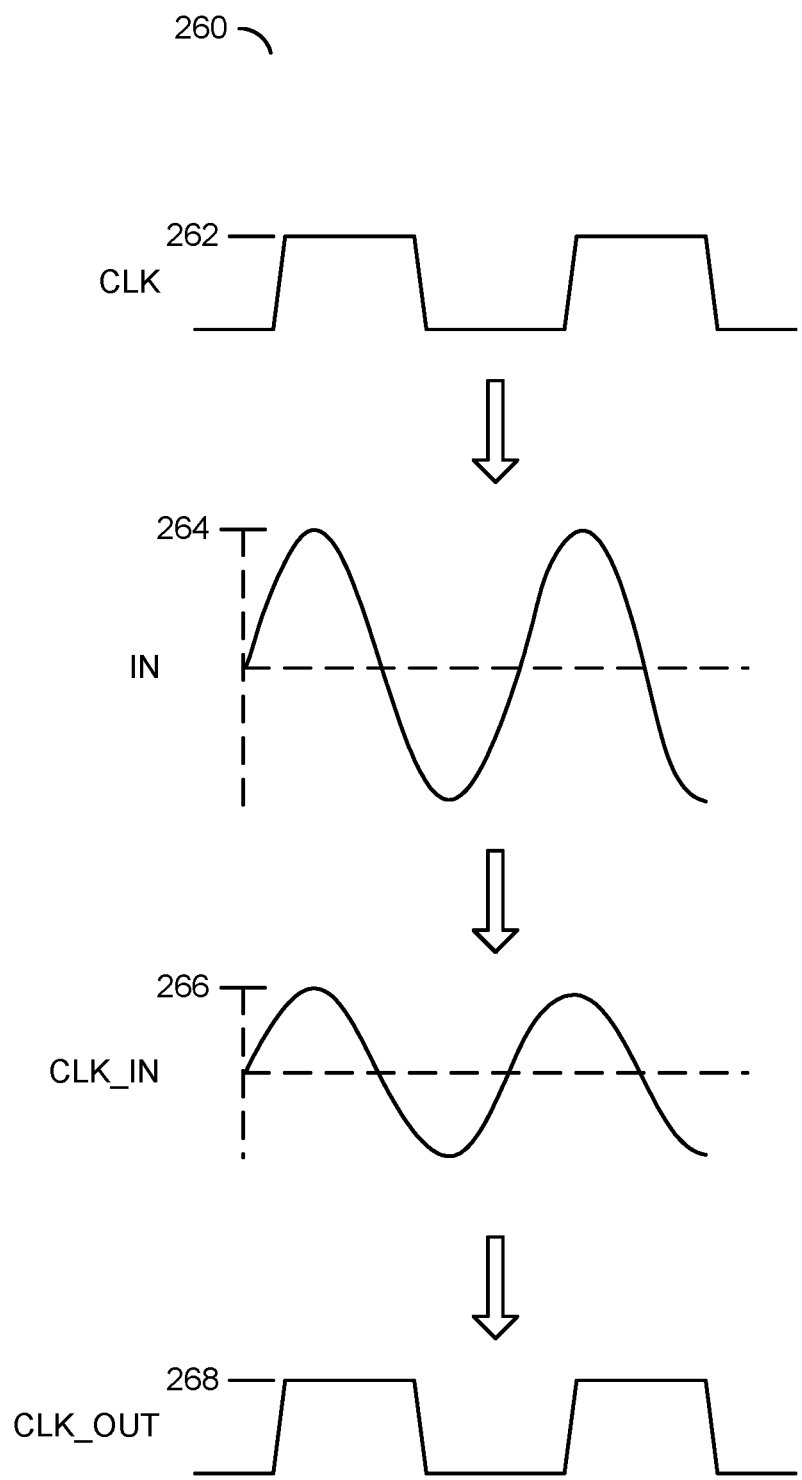
FIG. 12 is a diagram illustrating example waveforms of the clock signal propagating through the path of FIG. 11 in accordance with an example embodiment of the invention.

Referring to FIG. 12, a diagram illustrating example waveforms 260 of the clock signal propagating through the path 240 is shown in accordance with an example embodiment of the invention. The signal CLK may be received by the module 50a at the transformer 220 essentially as a square wave having a peak amplitude 262. The inductive coupling of the transformer 220 may convert the square wave of the signal CLK into a first harmonic sine wave in the signal IN. The signal IN may have a peak amplitude of 264. In general, the amplitude 264 may be slightly larger than the amplitude 262 due to the suppression of the third harmonic. The passive continuous time linear equalizers within the conditioner 130 may reduce the amplitude of the signal IN. The output signal CLK_IN generated by the conditioner 130 may have an amplitude 266.

In some embodiments, the amplitude 266 of the signal CLK_IN may approximately match the amplitude 262 of the signal CLK. As the signal CLK_IN propagates through the path 200, the amplitude of the clock signal may be reduced by each parasitic resistance RA-RB due to energy loss and subsequently amplified by the following amplifiers 202b-202c. The amplifiers (buffers) 202a-202c and the last stage of the digital buffer may reshape the clock signal such that the output clock signal CLK_OUT is essentially a square wave again. An amplitude 268 of the output clock signal CLK_OUT may approximately match the amplitude 266 of the input clock signal CLK_IN. In various embodiments, the amplitude 268 of the output clock signal CLK_OUT may also approximately match the amplitude 262 of the original clock signal CLK.

Figure 13:
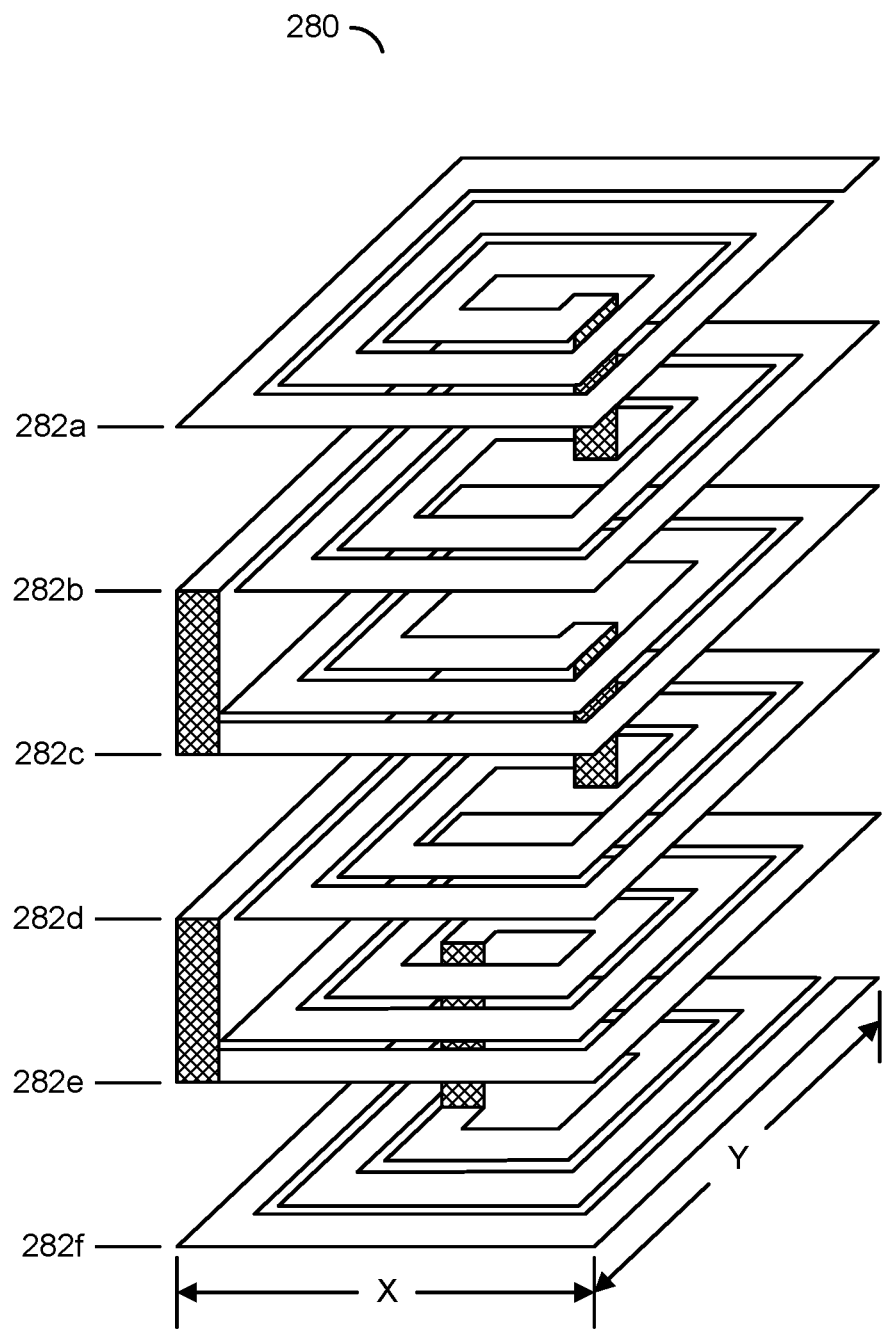
FIG. 13 is a diagram illustrating an inductor design in accordance with an example embodiment of the invention.

Referring to FIG. 13, a diagram illustrating an example implementation of an inductor 280 is shown in accordance with an example embodiment of the invention. The inductor 280 may be representative of the inductors LA-LB in the path 200 and/or the inductors (e.g., LD) used in the LRC passive continuous time linear equalizer circuits 132a-132c.

In an example embodiment, each LRC passive continuous time linear equalizer circuit 132a-132c may comprise an inductor (e.g., LD) and a capacitor (e.g., CD) between an input node and an output node (see FIG. 11). A resistor (e.g., RD) may be connected between the output node and a signal ground. A center frequency (fc) of the bandpass filter function may be calculated by formula 1 as follows:

$$fc = 1/\sqrt{2\pi LC} \quad (1)$$

A practical inductance of 1 nH to 10 nH may be fabricated on a silicon integrated circuit. For a center frequency of approximately 2.7 Ghz and the capacitor CD having a capacitance of 1.3 pF, the inductor LD may have an inductance of 2.5 nH per formula (that is within the practical range of 1 nH to 10 nH). With the resistor RD at a resistance of approximately 100 ohms, a quality factor of approximately 0.439 may be achieved.

A common 10 nH spiral inductor fabricated on a single conductive layer of an integrated circuit may occupy an area of approximately 200 micrometers (μm) by 200 μm. Various embodiments of the invention may reduce the silicon area consumed by each inductor by spreading the spiral among multiple (e.g., 4 to 8) conductive (e.g., metal) layers. Using six conductive layers 282a-282f, a 6 μm line width and a 4 μm spacing between lines, the inductor 280 may be created with a 10 nH inductance in an area (XxY) of only approximately 23 μm by 23 μm. The smaller area per inductor 280 may allow for denser circuitry in the integrated circuits used for the data buffers 70a-70n and/or the RCD 74.

Figure 14:
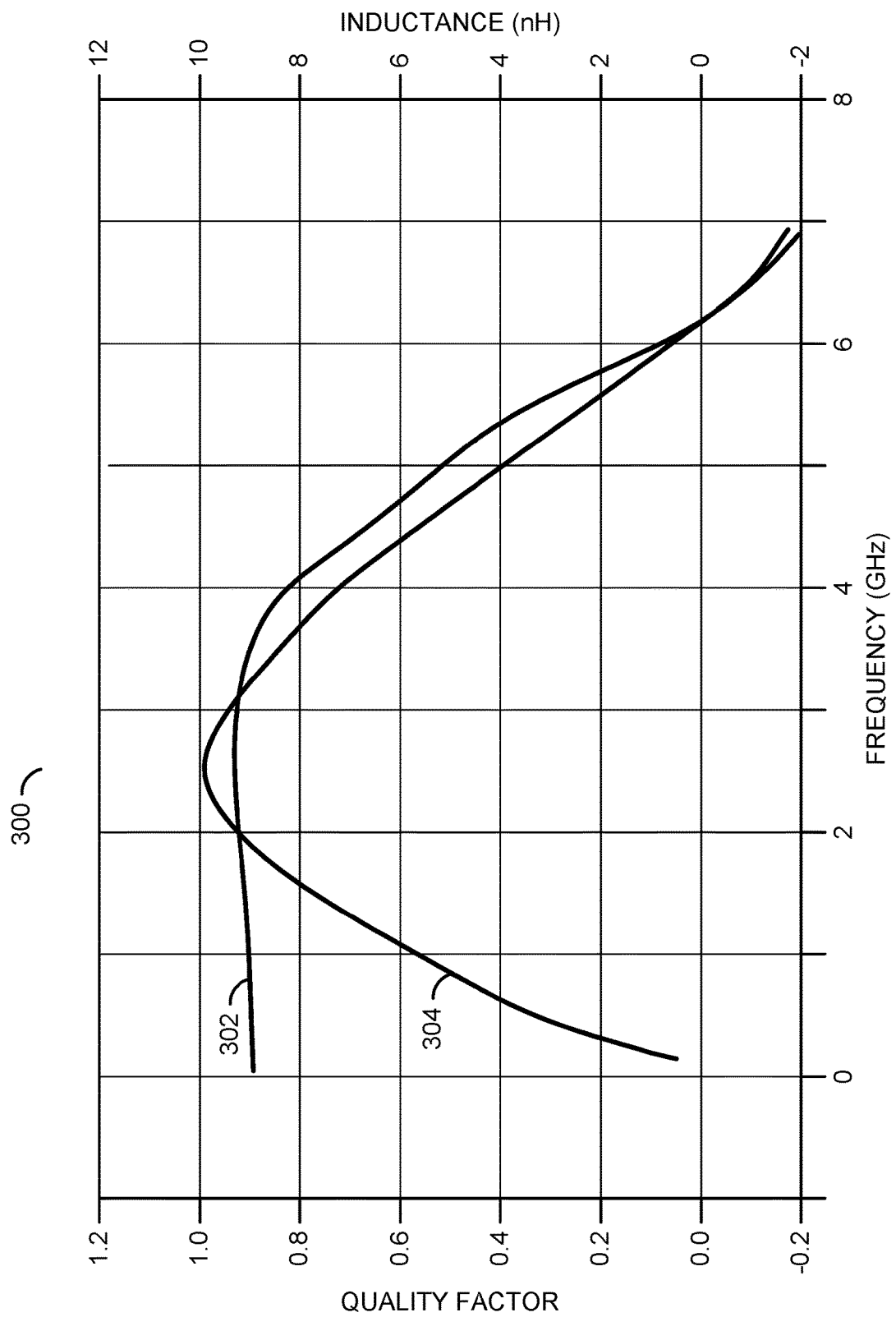
FIG. 14 is a diagram illustrating a performance of the inductor of FIG. 13 in accordance with an example embodiment of the invention.

Referring to FIG. 14, a diagram 300 illustrating an example performance of the inductor 280 is shown in accordance with an example embodiment of the invention. The diagram 300 generally illustrates an inductance and a quality factor over a range of frequencies from approximately zero hertz to approximately 7 GHz.

A curve 302 may illustrate an inductance of the inductor 280. The inductance may remain constant at about 9 nH from DC to approximately 3 GHz. At higher frequencies, the inductance may reduce linearly, reaching zero nH just above 6 GHz.

A curve 304 may illustrate a quality factor of the inductor 280. The quality factor may peak at a quality factor of approximately 1.0 near 2.5 GHz. The quality factor is generally less at both lower frequencies and higher frequencies. The curve 304 also shows a frequency sensitivity and response to the peak frequency. The high quality factor of the inductor in continuous time linear equalizers may provide better performance than an RC-based continuous time linear equalizers.

Although embodiments of the invention have been described in the context of DDR4 and DDR5 applications, the present invention is not limited to DDR4 and DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising
   a first continuous time linear equalizer circuit configured to generate an intermediate signal by filtering an input signal using a first passive bandpass filter having an inductor; and
   a second continuous time linear equalizer circuit configured to generate an output signal by filtering said intermediate signal, wherein said first continuous time linear equalizer circuit and said second continuous time linear equalizer circuit are implemented in one or more of (i) a double-data rate memory module, (ii) a data buffer of a memory module or (iii) a registered clock driver of said memory module.

2. The apparatus according to claim 1, wherein said second continuous time linear equalizer circuit comprises a second passive bandpass filter.

3. The apparatus according to claim 2, further comprising a third circuit (i) connected in series between said first continuous time linear equalizer circuit and said second continuous time linear equalizer circuit and (ii) configured to filter said intermediate signal using a third passive bandpass filter.

4. The apparatus according to claim 1, wherein said second continuous time linear equalizer circuit is further configured to amplify said intermediate signal.

5. The apparatus according to claim 1, further comprising a clock path circuit configured to generate one or more clock signals in response to said output signal.

6. The apparatus according to claim 5, wherein said clock path circuit comprises (i) a plurality of amplifiers connected in series and (ii) a plurality of tank circuits disposed between pairs of said amplifiers and each having a resonant frequency tuned to a frequency of said input signal.

7. The apparatus according to claim 6, wherein (i) a first amplitude of said input signal is higher than a second amplitude of said output signal due to energy loss in one or more resistances and (ii) said amplifiers generate said clock signals at a third amplitude that approximately matches said first amplitude of said input signal.

8. The apparatus according to claim 1, further comprising a transformer configured to inductively couple said input signal to said first continuous time linear equalizer circuit.

9. A method for signal filtering in a memory module, comprising the steps of:
   inductively coupling an input signal to a first continuous time linear equalizer circuit;
   generating an intermediate signal with said first continuous time linear equalizer circuit by filtering said input signal using a first passive bandpass filter having an inductor; and
   generating an output signal with a second continuous time linear equalizer circuit by filtering said intermediate signal.

10. The method according to claim 9, wherein said second continuous time linear equalizer circuit comprises a second passive bandpass filter.

11. The method according to claim 10, further comprising the step of:
    filtering said intermediate signal using a third continuous time linear equalizer circuit having a third passive bandpass filter.

12. The method according to claim 9, further comprising the step of:
    amplifying said intermediate signal.

13. The method according to claim 9, further comprising the step of:
    generating one or more clock signals in response to said output signal using a clock path circuit.

14. The method according to claim 13, wherein said clock path circuit comprises (i) a plurality of amplifiers connected in series and (ii) a plurality of tank circuits disposed between pairs of said amplifiers and each having a resonant frequency tuned to a frequency of said input signal.

15. The method according to claim 14, wherein (i) a first amplitude of said input signal is higher than a second amplitude of said output signal due to energy losses in one or more resistances and (ii) said amplifiers generate said clock signals at a third amplitude that approximately matches said first amplitude of said input signal.

16. The method according to claim 9, wherein the steps are implemented in one or more of (i) double-data rate memory module, (ii) a data buffer of a memory module or (iii) a registered clock driver of said memory module.

17. An apparatus comprising
    a first continuous time linear equalizer circuit configured to generate an intermediate signal by filtering an input signal using a first passive bandpass filter having an inductor;
    a second continuous time linear equalizer circuit configured to generate an output signal by filtering said intermediate signal; and
    a transformer configured to inductively couple said input signal to said first continuous time linear equalizer circuit.

18. The apparatus according to claim 17, wherein said first continuous time linear equalizer circuit and said second continuous time linear equalizer circuit are implemented in one or more of (i) a double-data rate memory module, (ii) a data buffer of a memory module or (iii) a registered clock driver of said memory module.

19. The apparatus according to claim 17, further comprising a clock path circuit configured to generate one or more clock signals in response to said output signal.

20. The apparatus according to claim 17, further comprising:
    a plurality of amplifiers connected in series, wherein said output signal is presented to an input of a first amplifier of said plurality of amplifiers; and
    one or more tank circuits disposed between pairs of said amplifiers, wherein each tank circuit has a resonant frequency tuned to a frequency of said input signal.

* * * * *